United States Patent [19]
Pooke et al.

[11] Patent Number: 5,849,671
[45] Date of Patent: Dec. 15, 1998

[54] SEPARATED REACTANTS PROCESSING OF HIGH $T_C$ SUPERCONDUCTORS

[75] Inventors: Donald Mark Pooke, Lower Hutt; Robert George Buckley, Northland; Jeffery Lewis Tallon, York Bay; Michael Staines, Days Bay, all of New Zealand; Alexander Otto, Chelmsford, Mass.

[73] Assignees: Industrial Research Limited, Lower Hutt, New Zealand; American Superconductor Corporation, Westborough, Mass.

[21] Appl. No.: 616,986

[22] Filed: Mar. 13, 1996

[51] Int. Cl.⁶ ....................................... B05D 5/12
[52] U.S. Cl. ........................ 505/430; 505/236; 505/433; 505/501
[58] Field of Search .................... 505/236, 430, 505/433, 501

[56] References Cited

U.S. PATENT DOCUMENTS

| | | | |
|---|---|---|---|
| 5,059,582 | 10/1991 | Chung | 505/701 |
| 5,068,219 | 11/1991 | Hagino et al. | 505/1 |
| 5,227,365 | 7/1993 | Van Den Sype | 505/739 |
| 5,395,821 | 3/1995 | Kroeger et al. | 505/431 |
| 5,447,291 | 9/1995 | Sandhage | 264/60 |
| 5,545,610 | 8/1996 | Higashiyama et al. | 505/501 |
| 5,556,830 | 9/1996 | Sun et al. | 505/501 |
| 5,585,332 | 12/1996 | Tanaka et al. | 505/501 |

OTHER PUBLICATIONS

K. Tachikawa et al., "Synthesis of Tl–Base High–Tc Superconducting Oxides through a Diffusion *Process*", *Jpn. J. Appl. Phys.*, vol. 32 (1993), pp. L654–L657.

B.A. Glowacki et al., "The Processing of Practical Y–Ba–Cu–O and Bi–Pb–Sr–Ca–Cu–O Wires and Tapes", *Research Review 1992, University of Canbridge.*

*Primary Examiner*—Robert Kunemund
*Attorney, Agent, or Firm*—Dann, Dorfman, Herrell and Skillman, P.C.

[57] ABSTRACT

A method for forming a conductor element comprising a Tl or Hg-based high temperature superconductor (HTSC) material, comprises providing at least one first precursor material within an outer sheath for the conductor element; providing at least one second precursor material within the conductor sheath and separated from the first precursor material(s) by a barrier layer formed from a Noble metal for example between the first and second precursor materials; and heating the conductor sheath containing the precursors to a temperature at which the barrier layer melts to allow the precursor materials to mix and react, or to a temperature at which one of the precursor material(s) diffuses through the barrier layer sufficiently allow the precursor materials to mix and react, to form the Tl or Hg-HTSC material within the outer conductor sheath.

25 Claims, 6 Drawing Sheets

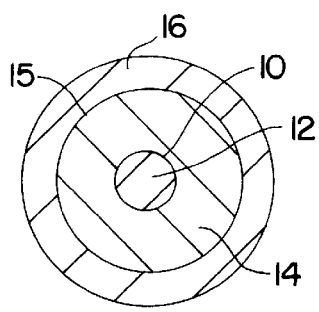
FIG. IA
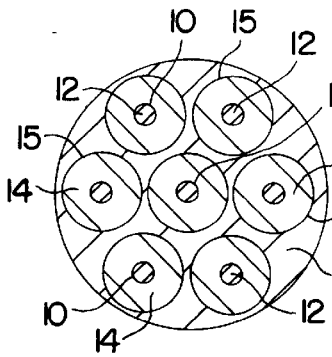
FIG. IB
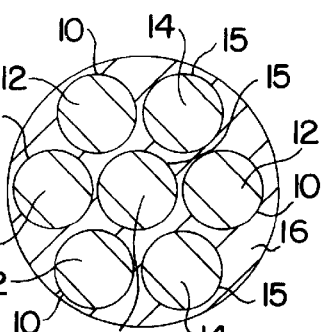
FIG. IC
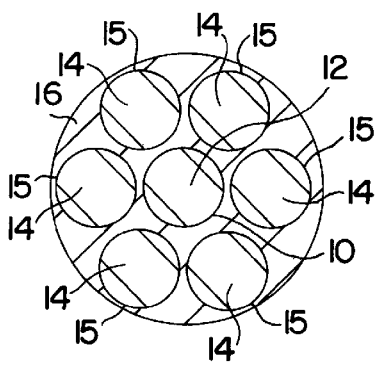
FIG. ID
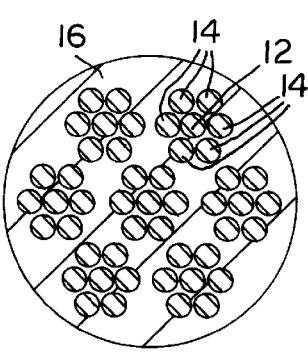
FIG. IE
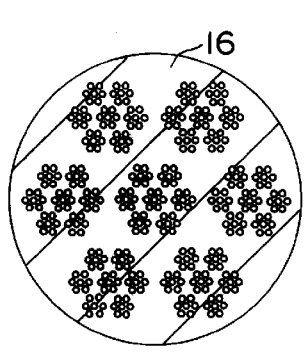
FIG. IF
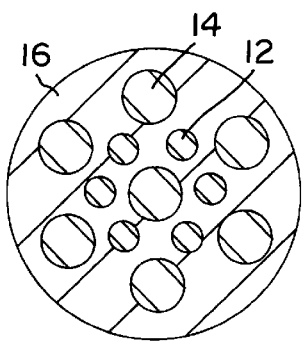
FIG. IG
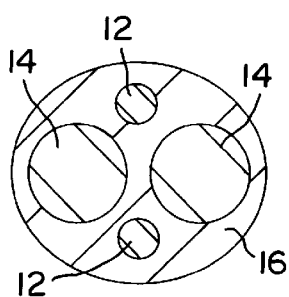
FIG. IH
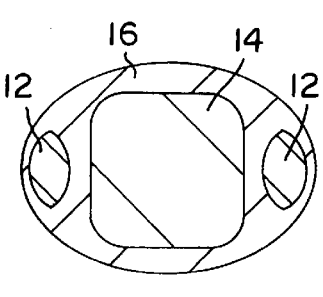
FIG. II

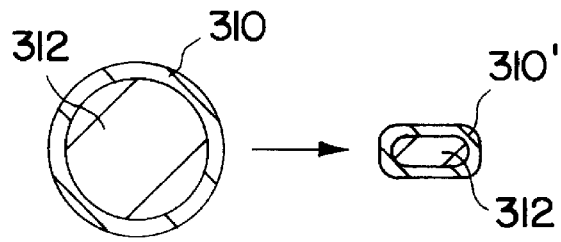
FIG. 3A
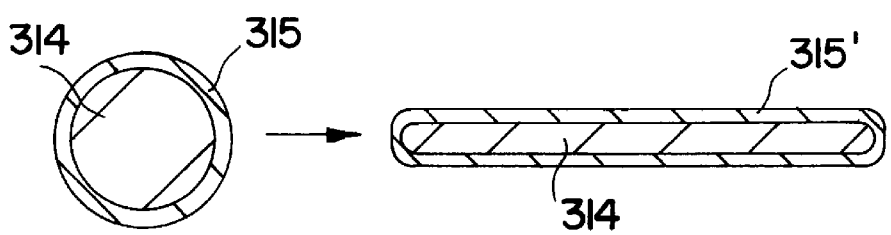
FIG. 3B
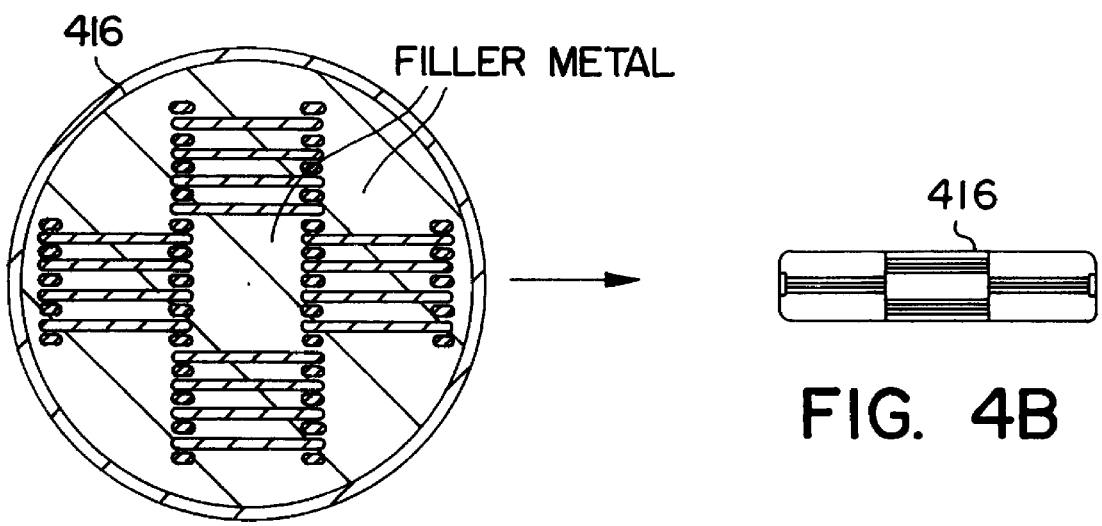
FIG. 4A
FIG. 4B

SEPARATED REACTANTS PROCESSING OF HIGH $T_C$ SUPERCONDUCTORS

FIELD OF INVENTION

The present invention comprises a method for forming cuprate, Tl or Hg-based high temperature superconducting wires, tapes and other conducting elements.

BACKGROUND

Many High-$T_c$ Superconducting Cuprates (HTSC) are known to have superconducting transition temperatures, $T_c$ exceeding the temperature at which liquid nitrogen boils, 77 K. As such they have a potentially large number of applications ranging from power generation, distribution, transformation and control, to high-field magnets, motors, body scanners, telecommunication and electronics. $T_c$ values may be of the order of 92 K for example for $YBa_2Cu_3O_{7-\delta}$, 109 K for example for $Bi_2Sr_2Ca_2Cu_3O_{10}$, 120K for example for $TlBa_2Ca_2Cu_3O_{10}$ or as high as 134 K for $HgBa_2Ca_2Cu_3O_{10}$. For many of these applications such $T_c$ values alone do not guarantee the utility of these HTSC at 77K or higher temperatures. Often these applications require large critical currents in the HTSC and this is not achieved unless the grains of the HTSC are crystallographically aligned, otherwise known as textured, and well sintered together. This is commonly achieved in thin-films wherein the HTSC material is deposited on a substrate in such a way as to obtain crystallographic alignment of the material. However, thin films, while supporting very high critical current densities, $J_c$, do not carry a very high absolute critical current, $I_c$, because they are so thin. Superconducting wires which use bulk superconducting material can in principle support much higher $I_c$ values provided they can be textured to achieve high $J_c$ values. In the case of superconducting wires which use the HTSC material of approximate composition $Bi_2Sr_2Ca_2Cu_3O_{10}$, it is common to utilise a combination of heat treatment and deformation in order to grow well-aligned well-sintered grains thus allowing critical currents at 77 K and zero field of up to 60,000 Amps/cm². This is the basis of the powder-in-tube (PIT) technique wherein precursor powder is loaded into a silver tube which is drawn down in diameter then subjected to a succession of cycles of partial reaction followed by rolling or pressing deformation to form high current-density tapes containing textured $Bi_2Sr_2Ca_2Cu_3O_{10}$. A key element in achieving high texture in this system is the fact that $Bi_2Sr_2Ca_2Cu_3O_{10}$ has an active deformation slip system which allows quasi-plastic deformation of individual grains at room temperature.

However, other HTSC including $TlBa_2CaCu_2O_7$, $Tl_{0.5}Pb_{0.5}Sr_2CaCu_2O_7$, $HgBa_2CaCu_2O_7$ and other materials referred to generally as 1212, $TlBa_2Ca_2Cu_3O_9$, $Tl_{0.5}Pb_{0.5}Sr_2Ca_2Cu_3O_9$, $HgBa_2Ca_2Cu_3O_9$ and other materials referred to generally as 1223, while they have exceptionally good flux pinning properties making these materials potentially far more attractive for wire technology than $Bi_2Sr_2Ca_2Cu_3O_{10}$, do not possess an active slip system. As a consequence, simple deformation coupled with heat treatment fails to induce sufficient texturing to obtain good current transport properties. To the best of our knowledge up to the present no group has successfully made high current-density wires or tapes using the PIT technique with any HTSC other than the bismuth cuprates, $Bi_2Sr_2CaCu_2O_8$ and $Bi_2Sr_2Ca_2Cu_3O_{10}$.

SUMMARY OF THE INVENTION

The invention comprises a method for forming a conductor element comprising a Tl or Hg-based high temperature superconductor (HTSC) material, comprising:

providing at least one first precursor material within an outer sheath for said conductor element;

providing at least one second precursor material within said conductor sheath and separated from the first precursor material(s) by at least one barrier layer between the first and second precursor materials; and heating the conductor sheath containing the precursors to a temperature at which the barrier layer(s) melt(s) to allow the precursor materials to mix and react, or to a temperature at which one of the precursor material(s) diffuses through the barrier layer sufficiently to allow the precursor materials to mix and react, to form the Tl or Hg-based HTSC material within the outer conductor sheath.

Preferably said at least one barrier layer comprises at least one hollow tube within the conductor sheath and containing the first precursor material(s).

The second precursor material(s) may also be provided within the conductor sheath so as to surround the barrier tube(s) containing the first precursor material(s), or the second precursor material(s) may also be contained within at least one second hollow tube within the outer sheath adjacent the first barrier tube(s) containing the first precursor material(s). In the latter case the second hollow tube(s) forming a further barrier layer around the second precursor material(s) melts on heating of the conductor sheath containing the precursor materials to the reaction temperature, or allows diffusion of the precursor material(s) through the second barrier layer at the reaction temperature.

In this specification "tube" is to be understood as including not only hollow bodies of circular cross-section but also of oval, square, rectangular, or other cross-sectional shapes and also such tubes in which the wall thickness of the tube varies around the cross-section of the tube.

DESCRIPTION OF PREFERRED FORMS

In one form of the method of the invention, the precursor materials or reactants required to synthesize the Tl or Hg-based HTSC material such as any of the Tl-2212 or Tl-2223, or Tl or Hg-based 1212 or 1223, are physically separated by, for example, loading one reactant as a powder or similar in one or more barrier tubes and the other reactants as a powder in one or more other barrier tubes, and placing these inside another larger tube forming an outer conductor sheath. The HTSC is then formed within the outer conductor sheath by heating the conductor sheath containing the precursor materials to the reaction temperature in an oxygen-containing atmosphere, such that one or more of the reactants eventually break through the separating metal walls to react with the remaining reactant(s) to produce a textured 2212, 2223, 1212 or 1223 superconductor. Alternative to placing the one reactant or precursor or group of reactants or precursors in one barrier tube and another reactant or group of reactants or precursors in another barrier tube, the second reactant or precursor or mixture of second reactants or precursors may be placed within the outer conductor sheath to surround the barrier tube containing the first reactant or group of reactants or precursors.

In another form of the method of the invention the reactants may be in the form of metal precursors, one or more of which are alloyed together to form a first precursor reactant, and some or all of the remainder of which are alloyed together to form a second precursor reactant. The reactants are then distributed in a wire such as a multifilamentary wire within a matrix of a barrier material, which forms a barrier layer between the reactants. The reactants are then oxidised at moderate temperature in an oxygen-containing atmosphere, and then subsequently reacted at high temperature in an oxygen-containing atmosphere, such that one or more of the reactants eventually breaks through the separating barrier matrix to react with the remaining reactant(s) to produce the textured HTSC material. In another form, one or more of the reactants may be a metal precursor alloyed with a noble metal.

Preferably the barrier material or barrier tube(s) comprise an alloy of a noble metal such as an alloy of silver, which may be an oxide dispersion strengthened alloy, or most preferably a pure noble metal such as silver. The walls of the barrier tube may be formed from the noble metal or alloy, or the noble metal or alloy may be present as a coating or layer on or around another metal. One or more of the reactants may form a melt in combination with the noble metal which allows the reactant to break through to the remaining reactants. Alternatively one or more of the reactants may be selected to have a high vapour pressure so as to allow significant in situ transport of the reactant(s) in the vapour phase through the barrier layer. Preferably one or more of the remaining reactants forms a melt in combination with the noble metal which enhances texturing of the cuprate superconductor at the interface with the noble metal upon reaction. As a further preferment, the barrier of noble metal separating the reactants may be sufficiently thick that one reactant does not break through to the others until significant melting has occurred within some or all of the remaining reactants.

One of the precursor materials may comprise a member (which may itself be a HTSC), such as a lower member, of the homologous series of compounds of which the HTSC is also a member, as is further described.

Preferably before reacting, the conductor sheath containing the precursor material(s) within one or more barrier tubes or in a noble metal matrix, is reduced to a smaller diameter by drawing, extruding, rolling, pressing or other deformation, to densify the reactants and to increase the surface to volume ration of the reactants. Alternatively the metal tube(s) containing the precursor material(s) may be reduced to a smaller diameter prior to loading into the outer conductor sheath.

The reaction stage is carried out at a temperature and oxygen pressure which produces the HTSC from the precursor(s), but which preferably also favours the growth of highly platey grains of the HTSC during the reaction. For example, for Tl-1212 the reaction may be carried out at a temperature in the range 750° C. to 870° C. and most preferably 750° C. to 850° C. and an oxygen partial pressure less than 1 bar and preferably less than 0.2 bar, for Tl-1223 the reaction may be carried out at a temperature in the range 800° C. to 935° C. and most preferably 870° C. to 925° C. and an oxygen partial pressure of 1 bar or less.

After reacting the conductor may be again drawn, rolled, pressed or subjected to other mechanical deformation to reduce any voids left by migration of the precursor material (s) during the reaction. During the reaction gaseous or mechanical pressure may be applied to collapse such voids and to assist in sintering the HTSC grains in the conductor sheath.

The process of the invention may be carried out to produce conductors comprising any HTSC including small variations in stoichiometry from the nominal compositions or any substituted form generally recognised in the art as being of Tl-2212, Tl-2223, Tl-1201, Tl-1212, Tl-1223, Hg-1201, Hg-1212, or Hg-1223 composition.

By 1212 is meant the nominal compositions $TlSr_2CaCu_2O_7$ or $HgBa_2CaCu_2O_{6+\delta}$ where, for example, Tl is optionally partially substituted by Pb and/or Bi, Hg is optionally partially substituted by Tl, Pb or Bi, Sr is optionally partially substituted by La or Ba, Ba is optionally partially substituted by Sr or La, and Ca is optionally partially substituted by R. These include $Tl_{0.5}Pb_{0.5}Sr_{2-w}Ba_wCaCu_2O_7$, $Tl_{0.5}Pb_{0.5}Sr_{2-x}La_xCaCu_2O_7$, $Tl_{0.5}Pb_{0.5}Sr_2Ca_{1-y}R_yCu_2O_7$, $Tl_{1-y}Bi_ySr_{2-u-v}La_uBa_vCaCu_2O_7$, and $Tl_{1-y}Bi_ySr_{2-v}Ba_vCa_{1-u}R_uCu_2O_7$ where $0 \leq x,w \leq 2$, $0 \leq u,v,y \leq 1$ and R is Y or any of the lanthanide rare earth elements, or more generally $(Tl,Pb,Bi)_1(Sr,Ba,La)_2(Ca,Tl,R)_2Cu_2O_7$. Also, La may be partially or completely substituted by Nd.

By 1223 is meant the nominal compositions $TlSr_2Ca_2Cu_3O_9$ or $HgBa_2Ca_2Cu_3O_{8+\delta}$ where Tl is optionally partially substituted by Pb and/or Bi, Hg is optionally partially substituted by Tl, Pb or Bi, Sr is optionally partially substituted by Ca or Ba and Ba is optionally partially substituted by Sr or La. These include $Tl_{0.5}Pb_{0.5}Sr_{2-x}Ca_2Ca_xCa_2Cu_3O_9$, $Tl_{0.5}Pb_{0.5}Sr_{2-w-x}Ba_wCa_xCa_2Cu_3O_9$, and $Tl_{1-y}Bi_ySr_{2-w}Ba_wCa_{2-u}R_uCu_3O_9$ where $0 \leq x,y,u,w \leq 1$ or more generally $(Tl,Pb,Bi)_1(Sr,Ba,La,Ca)_2(Ca,Tl,R)_2Cu_3O_9$. Preferred compositions for the thallium 1223 cuprate superconductors include $Tl_{0.9}Bi_{0.1}BaSr_{1.2}Ca_{1.8}Cu_3O_9$ and $Tl_{0.6}Pb_{0.4}Ba_{0.4}Sr_{1.6}Ca_{1.9}Cu_3O_9$.

In all of these compounds, as is known in the art, there may exist some degree of oxygen non-stoichiometry such that $O_5$, $O_7$ and $O_9$ may be interpreted as $O_{5+\delta}$, $O_{7+\delta}$ and $O_{9+\delta}$, in which $-0.3 \leq \delta \leq +0.3$ for example. There may also exist some degree of cation non-stoichiometry (for example Ca may be deficient by up to 0.2 mole fraction or Ba+Sr may be in excess) but the compounds will be generally recognised in the art by the above-noted indices.

Where the HTSC is Tl-1212 compound or 1223 compound as described above the first precursor material may be $Tl_2O_3$ and the second precursor material may be the thallium-free remnant oxide material (designated 0212 or 0223 respectively) such as to provide the 1212 or 1223 compound on full reaction with the $Tl_2O_3$.

Alternatively the first precursor material may be Tl-2212 or 2223 and the second precursor material may have the composition designated 0212 or 0223 respectively such that upon reaction 2212 and 0212−>1212 or 2223+0223−>2223. An exemplary reaction would be $Tl_2Ba_2Ca_2Cu_3O_{10} + Ba_2Ca_2Cu_3O_x −> TlBa_2Ca_2Cu_3O_9$.

DESCRIPTION OF DRAWINGS

In the accompanying figures:

FIGS. 1a–1i show examples of wire architectures for disposing filaments containing separated reactants according to the process of the invention;

FIGS. 3a and 3b show formation of non-circular cross-section filaments;

FIG. 4a shows one particular multifilamentary wire architecture and FIG. 4b shows the architecture of FIG. 4a after deforming into a tape;

DESCRIPTION OF PREFERRED FORMS OF WIRE ARCHITECTURES

Figure 2A:
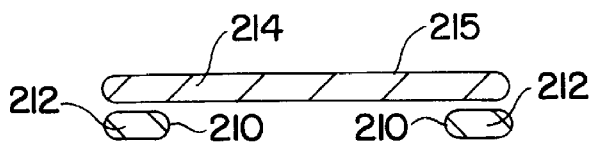
FIGS. 2a to 2f show further examples of wire architectures for disposing filaments containing separated reactants according to the process of the invention.

FIGS. 1a to 1i and 2a to 2f show various preferred forms of architectures for conductors formed by the method of the invention.

In FIG. 1a a barrier tube 10 contains a thallium core 12 and the barrier tube 10 is in turn surrounded by the non-thallium precursor materials 14 which are in turn contained with an outer sheath 16. In FIG. 1b a series of barrier tubes 10 are arranged within an outer sheath 16 each containing a thallium or mercury core 12 and are each surrounded by non-thallium or mercury precursor materials 14 which may in turn be contained with an outer tube 15, within the outer sheath. In FIG. 1c three barrier tubes 10 containing thallium or mercury precursors 12 are arranged with other barrier tubes 15 containing non-thallium or mercury precursors 14, as shown the—number of tubes in such a configuration is variable as desired. In FIG. 1d a central core 12 of thallium or mercury precursor within a barrier tube 10 is surrounded by barrier tubes 15 containing non-thallium or mercury precursors 14. Such conductors or filaments may in turn be contained as sub-units within a high filament count multifilamentary wire as shown in FIG. 1e, which may in turn form the sub-units of an again higher filament count multifilamentary wire as shown in FIG. 1f. FIGS. 1g to 1i show yet further arrangements of thallium or mercury and non-thallium or mercury precursors within an outer sheath.

Figure 2B:
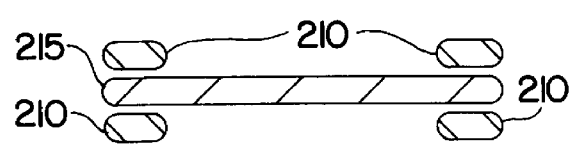

In FIG. 2a the non-thallium or mercury precursors 214 are contained within a barrier tube 215 which is a wide tape-like tube and the thallium or mercury precursors 212 are contained within narrower diameter tape-like tubes 210 on one side. In FIG. 2b thallium or mercury containing tapes or tubes 210 are arranged on both sides of the non-thallium or mercury containing tape-like tube 215, and in FIG. 2c alternating layers of thallium or mercury containing tubes 210 and non-thallium or mercury containing tubes 215 are stacked together as shown. In FIG. 2d, a wider tape-like tube 215 containing non-thallium or mercury precursor material 214 is surrounded by a number of thallium or mercury containing tubes 210 of smaller dimensions on either side. FIGS. 2e and 2f show arrangements of thallium and mercury and non-thallium and mercury containing tubes (210, 215), all of which are arranged in the same plane.

FIGS. 3a and 3b show how tape like tubes containing precursor materials, or tubes of non-circular cross section, may be formed. Hollow tubes 310, 315 of circular cross-section containing thallium or mercury precursor material 312 (FIG. 3a) or non-thallium or mercury precursor material 314 (FIG. 3b) are deformed by pressing or rolling or similar to non-circular cross-sectional shapes 310', 315'. The core precursor materials may be packed into the circular tubes as powders prior to deformation. Alternatively, circular or non-circular tubes may be formed by extrusion of the barrier material to a circular or non-circular shape. Powdered precursor material may be packed into the barrier tube at the point of formation of the barrier tube by extrusion or similar so that the barrier tube is effectively extruded around the powdered core, or alternatively a core of thallium or mercury metal may be extruded into and together with a surrounding barrier layer such as a noble metal.

Figure 2C:
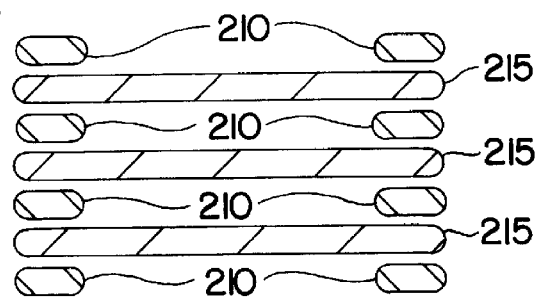
Figure 2D:
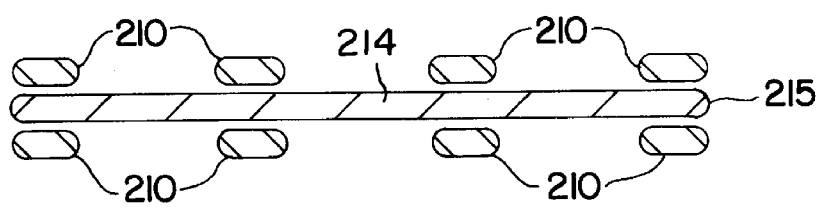
Figure 2E:
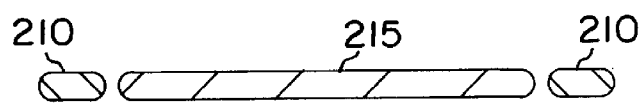
Figure 2F:
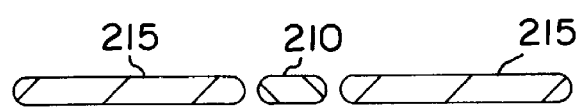
Figure 5:
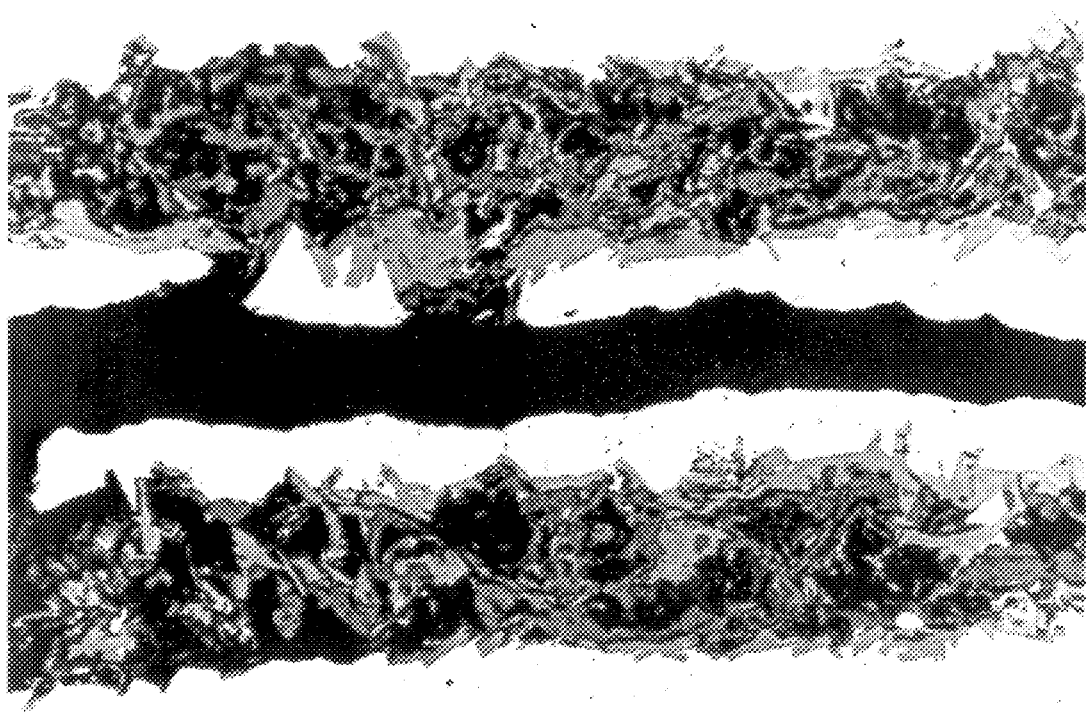
FIG. 5 shows a scanning electron micrograph of the cross section of separated-reactants tape processed according to example 1 showing the formation of textured plates of thallium-1223 at the oxide-silver interface—the black cavity is the remnant of the empty inner wire which contained the $Tl_2O_3$ source.
Figure 6:
FIG. 6 shows a scanning electron micrograph of the cross section of separated-reactants tape processed according to example 3 showing the formation of textured plates of thallium-1223 at the oxide-silver interface.

FIG. 4a shows how thallium or mercury and non-thallium or mercury containing tubes such as the configuration of FIG. 2c, may be packed together in an outer sheath as shown in FIG. 4a. The outer sheath 416 may be extruded or pressed or rolled to the tape configuration of FIG. 4b, for example, while maintaining the fundamental architecture of the tube or tape.

The precursor materials may be loaded into the tubes by packing powders or spin coating powders in fluid suspension and evaporation of the fluid carrier or by other suitable techniques.

The wire architectures described and shown in the drawings are described by way of example only.

EXAMPLES

The invention is further illustrated by the following examples:

Example 1

Separated reactants were reacted to form the 1223 superconductor $Tl_{0.9}Bi_{0.1}BaSr_{1.2}Ca_{1.8}Cu_3O_x$ using the powder-in-tube technique. $Tl_2O_3$ powder was loaded into a silver tube and drawn down to about 1.8 mm diameter. This wire was inserted into a silver tube and oxide precursor with stoichiometry $Bi_{0.1}BaSr_{1.2}Ca_{1.8}Cu_3O_x$ was packed around the central $Tl_2O_3$ wire to make a composite wire. The precursor comprised a mixture of $BaCu_2O_3$ and the remnant precursor to make up the stoichiometric composition $Bi_{0.1}BaSr_{1.2}Ca_{1.8}Cu_3O_x$. The $BaCu_2O_3$ was adopted because it forms a melt at about 890° C. in oxygen. The remnant precursor was made by mixing a stoichiometric mixture of the nitrates of Sr and Ca and oxides of Cu and Bi, decomposing the mixture by heating slowly to 750° C. in air and milling. The composite wire was drawn down to 0.5 mm diameter and rolled to a thickness of 0.2 mm, then reacted by heating to 900° C.

The critical current was determined, then the tape was sectioned for x-ray diffraction (XRD) and scanning electron microscopy (SEM) characterisation. FIG. 1 shows an SEM micrograph of a longitudinal section of the tape. Thallium oxide has broken through the wall of the central wire and reacted with the oxide precursor to form the desired 1223 composition. It can be seen that the 1223 has adopted significant levels of texture along the silver walls.

Further examples were explored in which the thallium source wire was drawn to different diameters, the composite wire was drawn to different diameters and rolled to different thicknesses in order to vary and control the silver wall thickness separating the reactants. Where the pre-reaction deformation was sufficiently large that the thallium source material ruptured through to the oxide reactant 1223 the resulting oxide was amorphous and there occurred little or no texturing of the fraction of 1223 that did form.

Example 2

The process of example 1 was repeated using a stoichiometric composition $Tl_{0.6}Pb_{0.4}Ba_{0.4}Sr_{1.6}Ca_{1.9}Cu_3O_x$. Similar texture was achieved along the silver walls and notably the composition of the reacted oxide was more homogeneous than was observed for the composition of example 1. Further experiments carried out on the same composition and heating schedule but where the reactants were not separated but homogeneously mixed showed that no such texturing occurred at the silver walls.

Example 3

The process of example 1 was repeated but using a different architecture for the separated reactant wires similar to that shown in FIG. 2d. The 1.3 mm diameter $Tl_2O_3$ wire was surrounded with 7 wires drawn to about 1.2 mm diameter containing the non-thallium precursor of stoichiometric composition $Bi_{0.1}BaSr_{1.2}Ca_{1.8}Cu_3O_x$. The bundle of 8 wires was loaded into a silver tube then drawn, rolled and reacted as described in example 1. During reaction the thallium broke through to the closest upper and lower filaments where a high degree of texture of the thus-formed 1223 was observed at the silver walls as shown in FIG. 3. Critical current densities of up to 24,000 amps/cm$^2$ were observed for these filaments.

Example 4

High-filament-count multifilamentary wires where a group of filament wires such as those of example 3 are cut into lengths, rebundled, drawn and rebundled multiple times will show similar texturing effects on reaction especially where metal precursors are used and the uniformity of the separating wall thickness is better controlled. Other examples of filament architectures are shown in FIG. 2. These and other such filaments may be used as the single composite wire or may be the subunits of a high-filament-count multifilamentary wire.

Example 5

Figure 7:
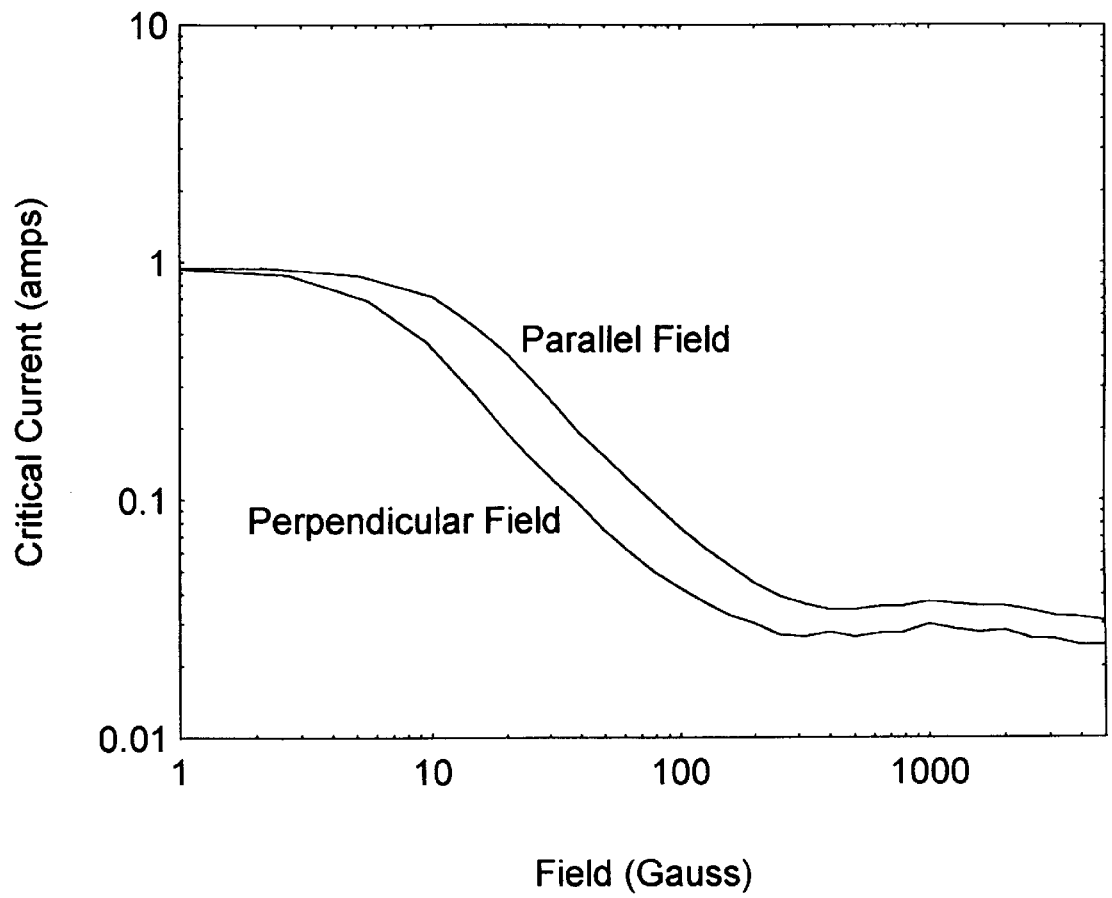
FIG. 7 is a graph of the critical current for the tape of Example 5 below plotted in amps against the applied magnetic field parallel and perpendicular to the normal vector from the plane of the tape.

A silver tube was loaded with $Tl_2O_3$ powder wire, drawn to down 1.8 mm diameter and then turned down to a 1.65 mm diameter. This was placed inside a 6 mm outer diameter, 4 mm inner diameter silver tube and the annular space between the tubes was packed with precursor oxide powder of composition $Pb_{0.4}Ba_{0.4}Sr_{1.6}Ca_{1.9}Cu_{3x}$, the relative proportions of precursor and $Tl_2O_3$ powder being designed to yield a final overall composition of $Tl_{0.6}Pb_{0.4}Ba_{0.4}Sr_{1.6}Ca_{1.9}Cu_3O_x$. This composite was then drawn to 0.5 mm and rolled to a 0.2 mm thickness tape. Sections of the wire tape were then cut and crimped closed at the ends and then heat treated by ramping from 690° C. to 920° C. at 1° C./min, held there for 60 min then ramped down to 840° C. at 0.5° C./min then withdrawn from the furnace. Scanning electron micrographs showed good areas of grain alignment away from where the thallium oxide had ruptured through, with very good alignment at the silver/superconductor interface. FIG. 7 shows the critical current for this tape plotted in amps against the applied magnetic field parallel and perpendicular to the normal vector from the plane of the tape. There is a marked anisotropy in critical current as high as 2x in the mid-field region. It is believed that this anisotropy results from the grain alignment achieved in the core of the wire tape.

The foregoing describes the invention including a preferred form thereof. Alterations and modifications as will be obvious to those skilled in the art are intended to be incorporated within the scope hereof as defined in the claims.

We claim:

1. A method for forming a conductor element comprising a Tl or Hg-based high temperature superconductor (HTSC) material, comprising:

providing at least one first precursor material within an outer sheath for said conductor element;

providing at least one second precursor material within said conductor sheath and separated from the first precursor material(s) by at least one barrier layer between the first and second precursor materials; and heating the conductor sheath containing the precursors to a temperature at which the barrier layer(s) melt(s) to allow the precursor materials to mix and react, or to a temperature at which one of the precursor material(s) diffuses through the barrier layer sufficiently to allow the precursor materials to mix and react, to form the Tl or Hg-HTSC material within the outer conductor sheath.

2. A method according to claim 1, wherein said at least one barrier layer comprises at least one hollow tube within the conductor sheath and containing the first precursor material(s).

3. A method according to claim 2, including providing the second precursor material(s) within the conductor sheath so as to surround the barrier tube(s) containing the first precursor material(s).

4. A method according to claim 2, including providing the second precursor material(s) within at least one second hollow tube within the outer sheath adjacent the first barrier tube(s) containing the first precursor material(s), said second hollow tube(s) forming a further barrier layer, around the second precursor material(s), which melts on heating of the conductor sheath containing the precursor materials to said reaction temperature, or allows diffusion of the precursor material(s) through said second barrier layer at said reaction temperature.

5. A method according to claim 3, wherein the first precursor material(s) are loaded in said barrier tube(s) which is/are then reduced to a smaller diameter by drawing or extruding the hollow tube(s) containing the precursor material(s) prior to loading the barrier tube(s) into the outer conductor sheath.

6. A method according to claim 4, wherein the second precursor material(s) are loaded in said barrier tube(s) which is/are then reduced to a smaller diameter by drawing or extruding prior to loading the barrier tube(s) into the outer conductor sheath.

7. A method according to claim 5, wherein the second precursor material(s) are loaded in said barrier tube(s) which is/are then reduced to a smaller diameter by drawing or extruding prior to loading the barrier tube(s) into the outer conductor sheath.

8. A method according to claim 1, wherein said barrier layer is formed from a Noble metal.

9. A method according to claim 2, wherein said barrier tube(s) are formed from a Noble metal.

10. A method according to claim 3, wherein said barrier tube(s) are formed from a Noble metal.

11. A method according to claim 4, wherein said barrier tube(s) are formed from a Noble metal.

12. A method according to claim 1, wherein said barrier layer is formed from silver metal.

13. A method according to claim 2, wherein said barrier tube(s) are formed from silver metal.

14. A method according to claim 3, wherein said barrier tube(s) are formed from silver metal.

15. A method according to claim 4, wherein said barrier tube(s) are formed from silver metal.

16. A method according to claim 2, wherein said barrier tube(s) are formed from an oxide dispersion strengthened alloy.

17. A method according to claim 1, wherein one or both of the first and second precursor materials each comprise a metal oxide or an alloy comprising metal oxide components.

18. A method according to claim 1, wherein the HTSC is of nominal composition $TlSr_2CaCu_2O_{7-\delta}$ (1212) where $-0.3 \leq \delta \leq +0.3$, Tl may be partially substituted by Pb and/or Bi, Sr may be partially substituted by La and/or Ba, and Ca may be partially substituted by Y or any of the lanthanide rare earth elements.

19. A method according to claim 18, wherein the HTSC is selected from the group consisting of $Tl_{0.5}Pb_{0.5}Sr_{2-w}Ba_wCaCu_2O_{7-\delta}$, $Tl_{0.5}Pb_{0.5}Sr_{2-x}La_xCaCu_2O_{7-\delta}$, or $Tl_{0.5}Pb_{0.5}Sr_2Ca_{1-y}R_yCu_2O_{7-\delta}$ where $0 \leq x,w \leq$, $0 \leq y \leq 1$, $-0.3 \leq \delta \leq +0.3$, R is Y or any of the lanthanide rare earth elements, and La may be partially or completely substituted by Nd.

20. A method according to claim 1, wherein the HTSC is of nominal composition $TlSr_2Ca_2Cu_3O_{9-\delta}$ (1223) where $-0.3 \leq \delta \leq +0.3$, Tl may be partially substituted by Pb or Bi and Sr may be partially or fully substituted by Ba.

21. A method according to claim 20, wherein the HTSC is selected from the group consisting of $Tl_{0.5}Pb_{0.5}Sr_{2-x}Ca_xCa_2Cu_3O_{9-\delta}$, $Tl_{0.5}Pb_{0.5}Sr_{2-w-x}Ba_wCa_xCa_2Cu_3O_{9-\delta}$ or $Tl_{1-x}Bi_xSr_{2-w}Ba_wCa_2Cu_3O_{9-\delta}$ where $0 \leq x,w \leq 1$ and $-0.3 \leq \delta \leq +0.3$.

22. A method according to claim 1, wherein the first precursor material is $Tl_2Ba_2CaCu_2O_8$ and the second precursor material is of composition $Ba_2CaCu_2O_x$ where Tl may be partially substituted by Pb or Bi, Ba may be partially substituted by Sr or La and Ca may be partially substituted by R where R is Y, or a lanthanide rare earth.

23. A method according to claim 1, wherein the first precursor material is $Tl_2Ba_2Ca_2Cu_3O_{10}$ and the second precursor material is of composition $Ba_2Ca_2Cu_3O_x$ where Tl may be partially substituted by Pb or Bi, and Ba may be partially substituted by Sr.

24. A conductor formed by the method of claim 1.

25. A conductor formed by the method of claim 4.

* * * * *